(12) United States Patent
Kang et al.

(10) Patent No.: US 9,224,763 B2
(45) Date of Patent: Dec. 29, 2015

(54) DISPLAY DEVICE AND METHOD OF MANUFACTURING THE SAME

(75) Inventors: Min Kang, Seoul (KR); Jong Kwang Lee, Daejeon Metropolitan (KR); Sang Hee Jang, Bucheon-si (KR); Jin Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 489 days.

(21) Appl. No.: 13/211,360

(22) Filed: Aug. 17, 2011

(65) Prior Publication Data

US 2012/0248480 A1 Oct. 4, 2012

(30) Foreign Application Priority Data

Mar. 28, 2011 (KR) .......................... 10-2011-0027611

(51) Int. Cl.
*H01L 33/50* (2010.01)
*H01L 27/12* (2006.01)
*H01L 27/32* (2006.01)

(52) U.S. Cl.
CPC ........ *H01L 27/1262* (2013.01); *H01L 27/1218* (2013.01); *H01L 27/3279* (2013.01)

(58) Field of Classification Search
None
See application file for complete search history.

(56) References Cited

U.S. PATENT DOCUMENTS

| 6,458,516 | B1* | 10/2002 | Ye et al. .................... 430/317 |
| 6,567,148 | B1 | 5/2003 | Akiyama et al. |
| 2010/0062586 | A1* | 3/2010 | Ohnuma et al. .............. 438/479 |
| 2010/0148159 | A1* | 6/2010 | Burgi et al. ..................... 257/40 |
| 2010/0301327 | A1* | 12/2010 | Kang et al. ...................... 257/43 |
| 2011/0215317 | A1* | 9/2011 | Yamazaki et al. ............... 257/43 |
| 2011/0303885 | A1* | 12/2011 | Vanheusden et al. ......... 252/513 |

FOREIGN PATENT DOCUMENTS

| JP | 2007-043131 | 2/2007 |
| JP | 2007-256805 | 10/2007 |
| JP | 2008-066567 | 3/2008 |
| JP | 2009-026900 | 2/2009 |
| KR | 10-2005-0117847 | 12/2005 |
| KR | 10-2006-0121268 | 11/2006 |
| KR | 10-0803426 | 2/2008 |
| KR | 10-0910977 | 7/2009 |

* cited by examiner

*Primary Examiner* — Evan Pert
*Assistant Examiner* — Leslie Pilar Cruz
(74) *Attorney, Agent, or Firm* — H.C. Park & Associates, PLC

(57) ABSTRACT

Provided are a display device and a method of manufacturing of the display device. The display device includes a substrate subjected to a primary preprocess; a conductor formed on the substrate and subjected to a secondary preprocess; and an insulating layer formed on the substrate and the conductor, in which the primary preprocess is performed for a surface energy of the first substrate higher than a first reference value and the secondary preprocess is performed for a surface energy of the conductor lower than a second reference value.

10 Claims, 19 Drawing Sheets

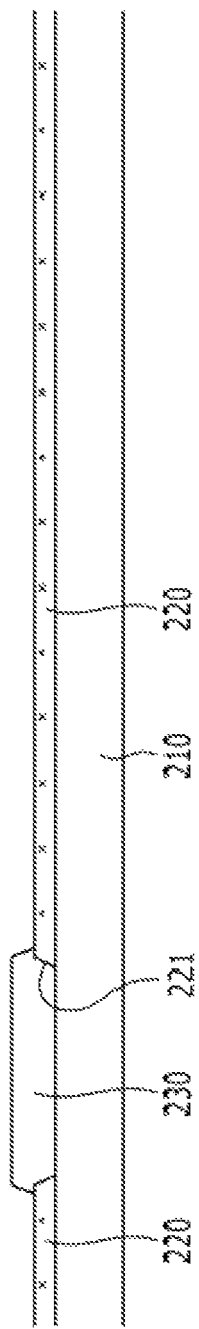

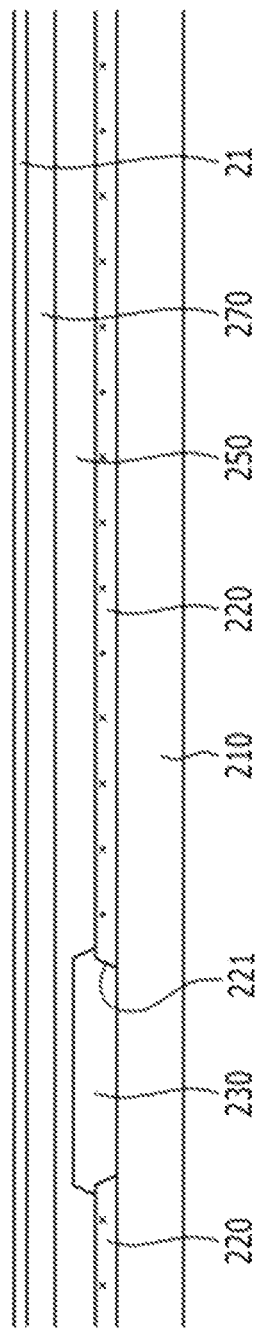

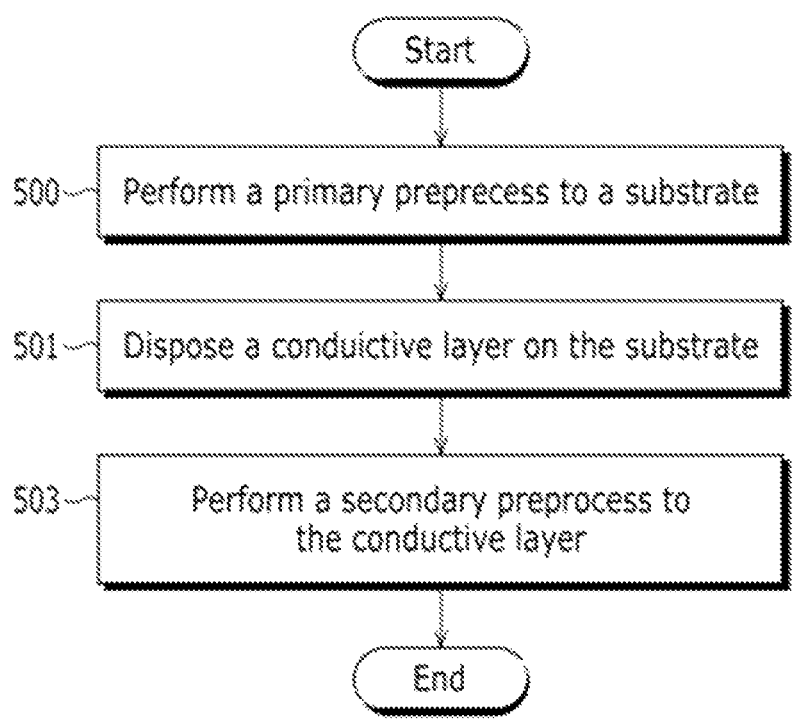

DISPLAY DEVICE AND METHOD OF MANUFACTURING THE SAME

CROSS-REFERENCE TO RELATED APPLICATION

This application claims priority to and the benefit of Korean Patent Application No. 10-2011-0027611, filed on Mar. 28, 2011, which is incorporated herein by reference for all purposes as if fully set forth herein.

BACKGROUND OF THE INVENTION

1. Field of the Invention

Exemplary embodiments of the present invention relate to a display device and a method of manufacturing of the display.

2. Description of the Background

In recent years, as display devices, flat panel displays have spawned significant adoption by consumers as an accepted mode of a display for business and personal uses. Manufacturers have fueled this acceptance by developing more enhanced display device for an application which requires a smaller size of a screen of a liquid crystal display and an organic light emitting diode display.

The liquid crystal display typically includes a pixel including a switching element implemented as a thin film transistor (TFT) which is a 3-terminal element and a panel provided with display signal lines such as a gate line and a data line.

The thin film transistor serves as the switching element that transfers or interrupts to a pixel a data signal through the data line according to a gate signal transferred through the gate line.

Unfortunately, as applications of the display devices demand both a large display area and a high resolution, a signal delay such as an RC delay may be inevitable, and as a result, the data signal cannot be sufficiently charged in each pixel, thereby deteriorating a display quality. Accordingly, technologies such as a low-resistance wire, increase in a wire thickness, a minute pattern, and the like are required to solve an RC delay. However, since an aperture ratio should not be decreased, the increase in the wire thickness is necessarily required as trade off for improving the aperture ratio.

On the other hand, in the case in which the wire thickness increases, steps of other layers to be positioned over the thick wires also increase that causes a probability of defects such as disconnections. Further, when flatness is deteriorated due to the increase of the steps, the liquid crystal molecules may move abnormally, and as a result, the performance of the liquid crystal display may be deteriorated.

Therefore, there is a need to improve flatness of a display.

The above information disclosed in this Background section is only for enhancement of understanding of the background of the invention and therefore it may contain information that does not form the prior art that is already known in this country to a person of ordinary skill in the art.

SUMMARY OF THE INVENTION

These and other needs are addressed by the present invention, in which exemplary embodiments of the present invention provide a display device and a method of manufacturing the same having advantages of improving flatness of a display.

Exemplary embodiments of the present invention disclose a display device. The display device includes a substrate having a first surface energy. The display device also includes a conductor disposed on the substrate and having a second surface energy. The first surface energy is higher than the second surface energy and a peak to valley which is a difference between a maximum thickness corresponding to the conductor and a minimum thickness corresponding to the substrate associated with patterning is minimized for an improved planarization.

Exemplary embodiments of the present invention disclose a method of manufacturing a display device. The method includes performing a preprocess to a substrate for a surface energy of the substrate. The method also includes disposing a conductive layer on the substrate. The method includes performing a preprocess to the conductive layer for a surface energy of the conductive layer lower than the surface energy of the substrate. The method also includes forming a conductor by patterning the conductive layer. The method includes forming an insulating layer on the substrate and the conductor.

Exemplary embodiments of the present invention disclose a display. The display includes a substrate having an attraction surface energy. The display also includes a conductor disposed on the substrate having a repulsion surface energy, a peak to valley thickness difference of an insulating layer between a minimum thickness corresponding to a surface of the substrate and a maximum thickness corresponding to the surface of the conductor for a planarization is minimized.

Exemplary embodiments of the present invention disclose a method. The method includes performing a preprocess to increase surface energy of a substrate using an attraction energy of interaction. The method also includes disposing a conductive layer on the preprocessed substrate. The method includes a preprocess to decrease surface energy of the conductive layer using a repulsion energy of interaction. The method includes patterning a gate by forming the conductive layer.

It is to be understood that both the foregoing general description and the following detailed description are exemplary and explanatory and are intended to provide further explanation of the invention as claimed.

BRIEF DESCRIPTION OF THE DRAWINGS

FIG. 15, FIG. 16, FIG. 17, FIG. 18 and FIG. 19 illustrate exemplary methods of manufacturing an upper panel of a liquid crystal display according to exemplary embodiments of the present invention.

FIG. 20 is a flowchart of process for improving flatness of a display using a preprocess according to exemplary embodiments of the present invention.

DETAILED DESCRIPTION OF THE EMBODIMENTS

Figure 1:
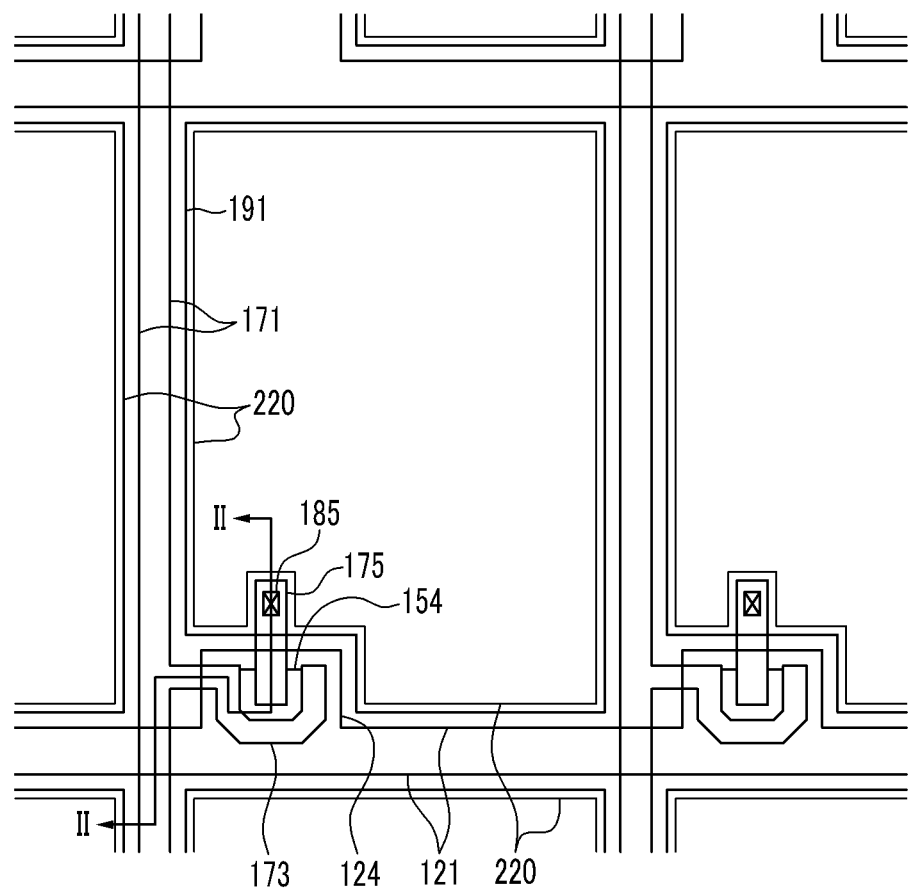
FIG. 1 is a layout view illustrating a liquid crystal display according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

In the drawings, thickness of layers, films, panels, and regions may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
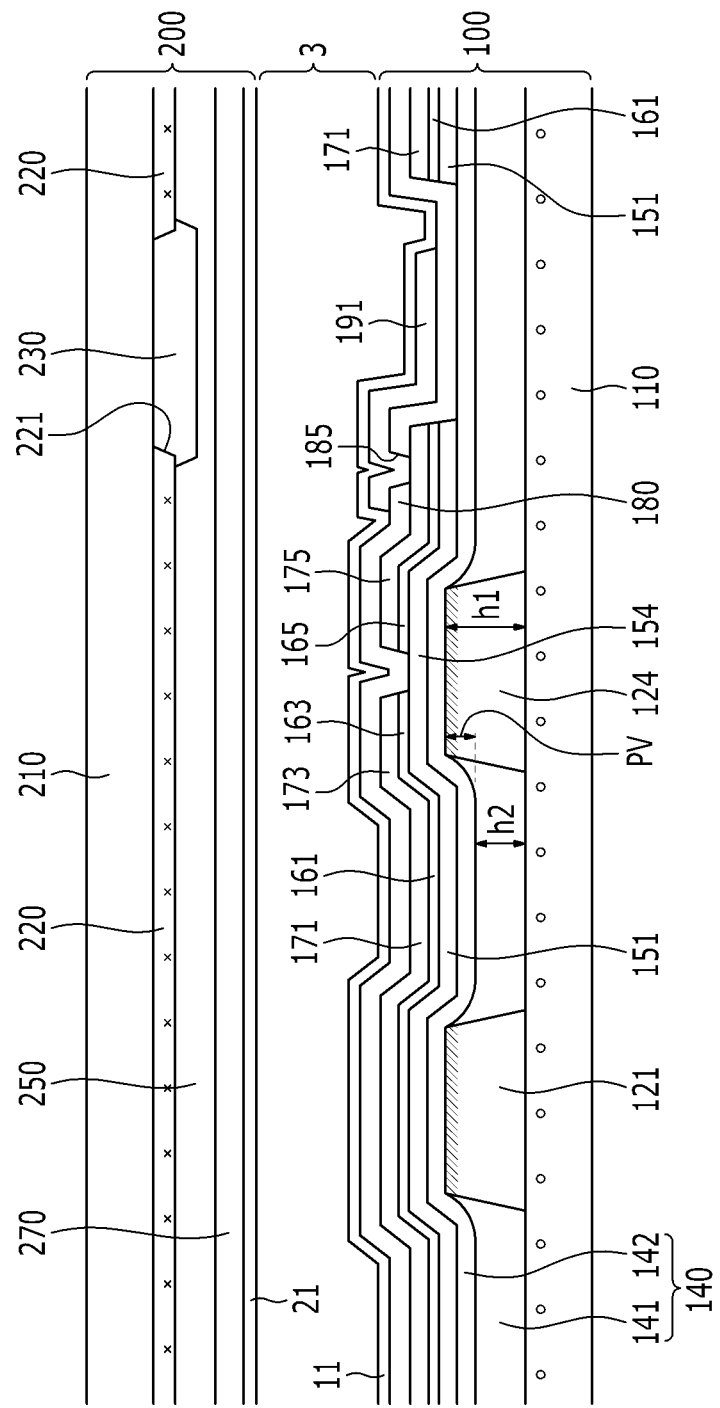
FIG. 2 is a cross sectional view illustrating the liquid crystal display taken along line II-II of FIG. 1.

FIG. 1 is a layout view illustrating a liquid crystal display according to exemplary embodiments of the present invention, and FIG. 2 is a cross sectional view illustrating the liquid crystal display taken along line II-II of FIG. 1.

Referring to FIG. 1 and FIG. 2, for example, the liquid crystal display includes a lower panel 100 and an upper panel 200 facing each other and a liquid crystal layer 3 interposed between the two panels 100 and 200. Polarizers (not shown) may be disposed on the outer surfaces of the panels 100 and 200.

First, the lower panel 100 will be described.

In this example, a gate conductor including a plurality of gate lines 121 is formed on a substrate 110 made of transparent glass or an insulating material such as plastic.

The gate line 121 transfers a gate signal, extends substantially in a horizontal direction, and includes a plurality of gate electrodes 124 protruding upwards and a wide end portion (not shown) for connecting other layer or a gate driver (not shown). When the gate driver (not shown) is integrated on the substrate 110, the gate line 121 extends to be directly connected thereto.

The gate conductor 121 of FIG. 2 may be made of low-resistance metal such as an aluminum-based metal such as aluminum (Al) or an aluminum alloy, a silver-based metal such as silver (Ag) or a silver alloy, gold (Au), and a copper-based metal such as copper (Cu) or a copper alloy. In addition, the gate conductor 121 may have a multilayer structure including two conductive layers (not shown) having different physical properties. In addition, the gate conductor 121 may be made of various metals or conductors.

In order to reduce RC delay, a thickness h1 for the substrate 110 of the gate conductor 121 may be thickly formed. For example, the thickness h1 of the gate conductor 121 may be 0.3 um to 2 um.

A gate insulating layer 140 is formed on the substrate 110 and the gate conductor 121. The gate insulating layer 140 may have a dual-layered structure including a first insulating layer 141 and a second insulating layer 142. In addition, the gate insulating layer 140 may have a single-layered structure.

The first insulating layer 141 may be made of an organic insulator. For example, the first insulating layer 141 may be made of silsesquioxane (SSQ) such as hydrogen silsesquioxane (HSQ), methylsilsesquioxane (MSQ), or the like. In addition, the first insulating layer 141 may be made of a high heat-resisting material. The first insulating layer 141 may not be formed on the gate conductor 121.

The second insulating layer 142 is formed on the first insulating layer 141 and the exposed gate conductor 121. For example, the second insulating layer 142 may be made of silicon nitride (SiNx), silicon oxide (SiOx), or the like.

The substrate 110 is subjected to a primary preprocess (circle mark) so that surface energy of the substrate 110 is larger than a first reference value and the gate conductor 121 is subjected to a secondary preprocess (solidus mark) so that surface energy of the gate conductor 121 is smaller than a second reference value. The surface energy of a layer, a film, an area, or a plate means a value converting a contact angle into energy after measuring each contact angle using a polar solvent and a non-polar solvent for the surface of a layer, a film, an area, or a plate. For example, the polar solvent may be $H_2O$ and the non-polar solvent may be $CH_2I_2$.

The first reference value may be the surface energy of the first substrate 110 before performing the primary preprocess. When the first substrate 110 is made of glass, the surface energy of the first substrate 110 without performing the primary preprocess may be about 50 J. The second reference value may be the surface energy of the gate conductive layer 120 before performing the secondary preprocess. When the gate conductive layer 120 is made of a copper-based metal or the like, the surface energy of the gate conductive layer 120 without performing the secondary preprocess may be about 55 J.

The surface energy of the primary preprocessed substrate 110 may be 55 J or more and the surface energy of the secondary preprocessed gate conductor 121 may be 30 J or less.

The surface energy of the primary preprocessed substrate 110 is increased and the surface energy of the secondary preprocessed gate conductor 121 is decreased. Accordingly, the substrate 110 having high surface energy has a high affinity with the first insulating layer 141 and the gate conductor 121 having low surface energy has a low affinity with the first insulating layer 141.

When the first insulating layer 141 is formed on the primary preprocessed substrate 110 and the secondary preprocessed gate conductor 121, the first insulating layer 141 may be thickly formed on the substrate 110 having high surface energy. On the other hand, the first insulating layer 141 may not be thickly formed on the gate conductor 121 having low surface energy. Accordingly, a Peak to Valley (PV) which is a difference between a maximum thickness h1 and a minimum thickness h2 of the first insulating layer 141 may be reduced and the flatness of the first insulating layer 141 may be improved. As the Peak to Valley (PV) of the first insulating layer 141 is reduced, the flatness of the first insulating layer 141 may be improved. The flatness of the first insulating layer 141 may be 0.6 um or less. According to the exemplary embodiments of the present invention, the Peak to Valley (PV) of the first insulating layer 141 which is formed on the primary preprocessed substrate 110 and the secondary preprocessed gate conductor 121 may be decreased by about 20% or more as composed with the Peak to Valley (PV) without performing the primary preprocess and the secondary preprocess.

Hereinafter, the primary preprocess and the secondary preprocess will be described with reference to FIG. 3 and FIG. 4.

Figure 3:
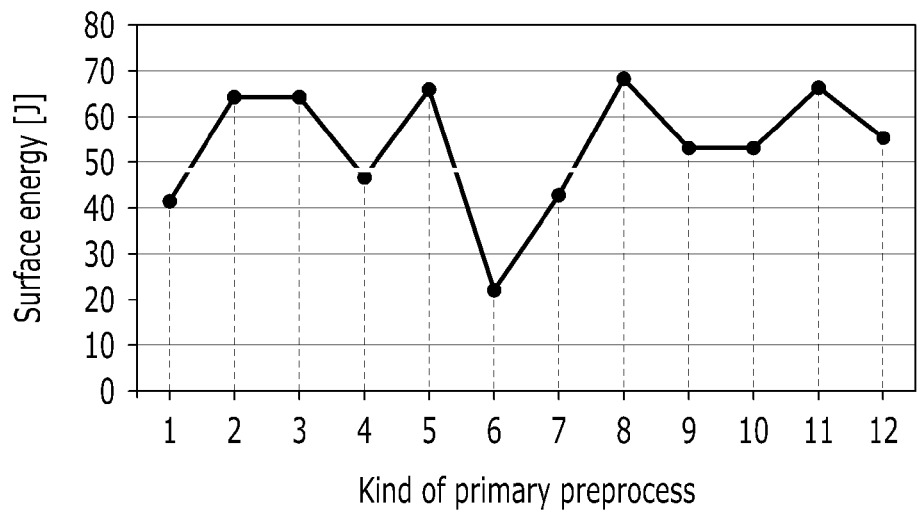
FIG. 3 and FIG. 4 illustrate surface energy when various preprocesses are performed on each substrate and conductive layer.
Figure 4:
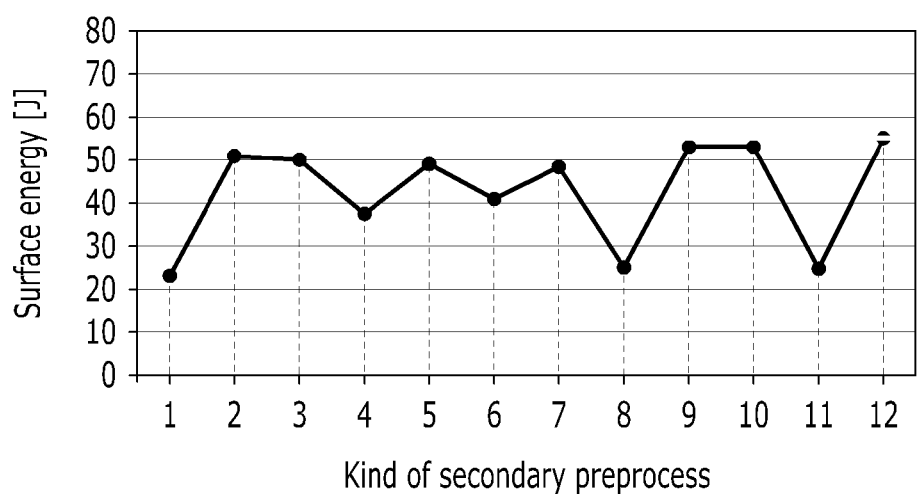

FIG. 3 and FIG. 4 represent surface energy when various preprocesses are performed on each substrate and conductive layer.

FIG. 3 is a graph illustrating surface energy of a substrate in the case where various primary preprocesses (i.e., primary preprocess No. 1 to No. 12) are performed on the substrate, and FIG. 4 is a graph illustrating surface energy of a conductive layer in the case where various secondary preprocesses (i.e., secondary process No. 1 to No. 12) are performed on the conductive layer. By way of example, the substrate of FIG. 3 is made of glass and the conductive layer of FIG. 4 is made of a copper-based metal.

Figure 9:
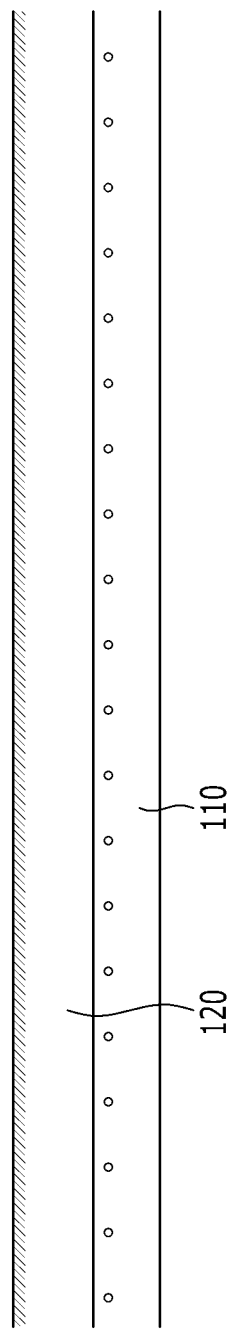

Referring to FIG. 3 and FIG. 4, the surface energy of the substrate without performing the primary preprocess is about 50 J and in FIG. 9, the surface energy of the conductive layer without performing the secondary preprocess is about 55 J.

The following Table illustrates each preprocess of the primary preprocess and the secondary preprocess with respect to cases of No. 1 to No. 12 of FIG. 3 and FIG. 4.

TABLE 1

| Case | Kind of preprocess |
|---|---|
| No. 1 | $CF_4$, 30 seconds, washing 0 time |
| No. 2 | $CF_4$, 30 seconds, washing 1 time |
| No. 3 | $CF_4$, 30 seconds, washing 3 times |
| No. 4 | $CF_4$, 10 seconds, washing 0 time |
| No. 5 | $CF_4$, 10 seconds, washing 1 time |
| No. 6 | photoresist coating(Photoresist coating) |
| No. 7 | HMDS(Hexamethyl-disilzane) 1 time |
| No. 8 | acid treatment |
| No. 9 | base treatment |
| No. 10 | UV treatment |
| No. 11 | $O_2$ |
| No. 12 | brushing |

In the above Table, for example, a preprocessing material of each case may be preprocessed on the substrate and the conductive layer using a plasma enhanced chemical vapor deposition (PECVD) method. The preprocessing material is physically and chemically absorbed on the surface of the substrate and the surface of the conductive layer through the preprocess and the surface energy of the substrate or the surface energy of the conductive layer is changed.

In the above Table, for example, carbon tetrafluoride ($CF_4$) is used as the preprocessing material in cases No. 1 to No. 5, but Sulfur hexafluoride ($SF_6$) instead of $CF_4$ may be used.

Referring to the above Table and FIG. 3, the primary preprocesses of cases No. 2, No. 3, No. 5, and No. 8 to No. 12 increase the surface energy of the substrate as compared with the case where the primary preprocess is not performed on the substrate. Particularly, the surface energy of the primary preprocessed substrate of cases No. 2, No. 3, No. 5, No. 8, and No. 11 may be increased by about 60 J or more.

Accordingly, for example, the primary preprocess may be performed by processing one of $SF_4$, $CF_4$, and $O_2$ on the substrate through the PECVD method. When $SF_4$ or $CF_4$ is used as the primary preprocessing material, the substrate may be washed at least one time or more after $SF_4$ or $CF_4$ is processed by the PECVD method. In this example, the preprocessing time of the PECVD method may be 10 seconds or more.

Referring the above Table and FIG. 4, the secondary preprocesses of all the cases except for the case No. 12 in which the secondary preprocess is brushing decrease the surface energy of the conductive layer as compared with the case where the secondary preprocess is not performed on the conductive layer. In particular, the surface energy of the secondary preprocessed conductive layer of cases No. 1, No. 8, and No. 11 is deceased by about 30 J or less.

Accordingly, the secondary preprocess may be performed by processing one of $SF_4$, $CF_4$, and $O_2$ on the conductive layer through the PECVD method or acid treatment. When $SF_4$ or $CF_4$ is used as the secondary preprocessing material, $SF_4$ or $CF_4$ may be processed on the conductive layer through the PECVD method. In this example, the preprocessing time of the PECVD method may be 30 seconds or more and the conductive layer may be not washed after being processed through the PECVD method.

The surface energy of the secondary preprocessed conductive layer is not largely changed even after patterning using such as photolithography.

Referring back to FIG. 1 and FIG. 2, for example, a plurality of linear semiconductors 151 made of hydrogenated amorphous silicon (a-Si is an acronym for amorphous silicon), or polysilicon are formed on the gate insulating layer 140. Each linear semiconductor 151 extends substantially in a vertical direction and a plurality of semiconductors 154 extend toward the gate electrode 124 from the linear semiconductor 151.

Ohmic contacts 161 and 165 including a plurality of linear ohmic contacts 161 and a plurality of island ohmic contacts 165 are formed on the linear semiconductor 151. The linear ohmic contact 161 has a plurality of protrusion portions 163 and the protrusion portion 163 and the island ohmic contact 165 are disposed on the semiconductor 154 by facing each other based on the gate electrode 124 to make a pair. The ohmic contacts 161 and 165 may be made of a material such as n+ hydrogenated amorphous silicon which is doped by an n-type impurity such as phosphorus at the high concentration or silicide.

A data conductor including a plurality of data lines 171 and a plurality of drain electrodes 175 is formed on the ohmic contacts 161 and 165.

The data line 171 transfers a data signal and extends substantially in a vertical direction to cross the gate line 121. Each data line 171 includes a plurality of source electrodes 173 which extend toward the gate electrode 124 to be bent in a U shape and a wide end portion (not shown) for connecting other layer or a data driver (not shown). When the data driver (not shown) is integrated on the substrate 110, the data line 171 extends to be directly connected therewith.

The drain electrode 175 is separated from the data line 171 and faces the source electrode 173 based on the gate electrode 124. A part of the drain electrode 175 is surrounded by the bent source electrode 173.

The data conductors 171 and 175, for example, may be made of a refractory metal such as molybdenum, chromium, tantalum, and titanium or an alloy thereof and have a multilayer structure including a refractory metal layer (not shown) and a low-resistance conductive layer (not shown). In addition, the data conductors 171 and 175 may be made of the same kind of metal as the gate conductor 121.

A portion disposed at an interface of the gate conductor 12 among the linear semiconductor 151, the ohmic contacts 161 and 165, and the data conductors 171 and 175 have a gentle slope. This is because the slope of the lower gate insulating layer 140 is gentle. The linear semiconductors 151, the ohmic contacts 161 and 165, and the data conductors 171 and 175 are not sharply changed in heights due to the gate insulating layer 140 having the gentle slope, thus a defective such as disconnection may be prevented.

The gate electrode 124, the semiconductor 154, the source electrode 173, and the drain electrode 175 form a thin film transistor (TFT) Q. A channel of the thin film transistor is formed at the semiconductor 154 between the source electrode 173 and the drain electrode 175.

As described above, the first insulating layer 141 among the gate insulating layers 140 may not be formed on the gate conductor 121. Accordingly, the first insulating layer 141 is not at the channel portion of the thin film transistor. Therefore, since only the second insulating layer 142 is disposed between the gate electrode 124 and the semiconductor 154, a distance between the gate electrode 124 and the channel is prevented from being far away from each other such that a property of the thin film transistor is not deteriorated.

The linear semiconductor 151 including the semiconductor 154 has nearly the same plane shape as the data line 171, the drain electrode 175, and the ohmic contacts 161 and 165 therebelow, except for the channel area between the source electrode 173 and the drain electrode 175. According to exemplary embodiments, the ohmic contacts 161 and 165 have substantially the same plane shape as the data line 171 and the drain electrode 175, but the linear semiconductor 151 has an exposed portion between the source electrode 173 and the drain electrode 175 without being covered by the data conductors 171 and 175 and the ohmic contacts 161 and 165.

For example, a passivation layer 180 is formed on the data conductors 171 and 175 and the exposed portion of the semiconductor 154. The passivation layer 180 may be made of an inorganic insulator or an organic insulator.

A contact hole 185 exposing the drain electrode 175 is formed at the passivation layer 180.

A plurality of pixel electrodes 191 are formed on the passivation layer 180. The pixel electrode 191 may be made of a transparent conductor such as indium-tin-oxide (ITO), or indium-zinc-oxide (IZO), as an example.

The pixel electrode 191 is entirely a quadrangle and is connected with the drain electrode 175 through the contact hole 185. When the thin film transistor is turned on, the pixel electrode 191 receives the data signal from the drain electrode 175.

For example, an alignment layer 11 is formed on the pixel electrode 191 and the passivation layer 180. The alignment layer 11 may be a vertical alignment layer.

In FIG. 2, the lower panel 100 where the data conductors 171 and 175 are formed on the gate conductor 121 is described as an example, but the exemplary embodiments of the present invention may be also applied at the lower panel having a top gate structure where the gate conductor is formed on the data conductor. That is, in the lower panel having the top gate structure, the insulating layer is formed on the primary preprocessed substrate increasing the surface energy and the secondary preprocessed data conductor decreasing the surface energy to improve the flatness of the insulating layer. In addition, the gate conductor may be formed on the insulating layer having improved flatness.

For example, the secondary preprocess according to exemplary embodiments of the present invention can be also applied at other conductors such as the data conductor in addition to the gate conductor. The surface energy of the substrate can be increased and the surface energy of the conductor can be decreased through the primary preprocess on the substrate and the secondary preprocess on the conductor disposed above the substrate. As a result, the flatness of the insulating layer formed on the substrate and the conductor can be improved.

Next, the upper panel 200 will be described.

The upper panel 200 has a light blocking member 220 which is formed on a substrate 210 made of an insulating material such as transparent glass or plastic. The light blocking member 220 referred as a black matrix is provided to prevent light leakage between the pixel electrodes 191. For example, the light blocking member 220 includes a plurality of openings 221 facing the pixel electrode 191 and having nearly the same shape as the pixel electrode 191.

A plurality of color filters 230 are formed on the substrate 210 and the light blocking member 220. The color filters 230 are mostly in the openings 221 of the light blocking member 220. Each color filter 230 may display one of three primary colors such as red, green and blue.

The light blocking member 220 is subjected to a tertiary preprocess (x mark) so that the surface of the light blocking member 220 has a repellence for the color filter 230. The plurality of openings 221 are formed by etching the tertiary preprocessed light blocking member 220. For example, color materials including pigments are coated in each of the plurality of openings 221 of the light blocking member 220 by an inkjet printing method to form the color filter 230.

The light blocking member 220 is tertiary-preprocessed so that the surface of the light blocking member 220 has a high repellence for the color materials, before forming the openings 221. For example, when the color material is a hydrophilic material, the surface of the light blocking member 220 may be subjected to preprocess so as to have a hydrophobic property through the tertiary preprocess. In this example, the light blocking member 220 may be subjected to the tertiary preprocess with the hydrophobic material by the PECVD method.

Since the openings 221 are formed at the light blocking member 220 after the tertiary preprocess, the side of the light blocking member 220 where the openings 221 are formed and the surface of the substrate 210 where the openings 221 are exposed do not have the hydrophobic property and only the surface of the light blocking member 220 has the hydrophobic property.

The color material is repelled with the surface of the light blocking member 220 through the tertiary preprocess and the color material is coated only in the openings 221 of the light blocking member 220, such that the color filter 230 can be formed only in the openings 221.

Unlike in FIG. 2, for example, the light blocking member 220 and the color filter 230 may be formed on the lower panel 100.

An overcoat 250 is formed on the light blocking member 220 and the color filter 230. The overcoat 250 may being made of an insulator, prevents the color filter 230 from being exposed, and provides a flat surface. The overcoat 250 may be omitted to avoid unnecessarily obscuring the present invention.

For example, a common electrode 270 is formed on the overcoat 250. The common electrode 270 is made of a transparent conductor such as ITO or IZO and receives common voltage Vcom. An alignment layer 21 may be formed on the common electrode 270. The alignment layer 21 may be a vertical alignment layer.

The liquid crystal layer 3 interposed between the lower panel 100 and the upper panel 200 includes liquid crystal molecules having dielectric anisotropy and in the state in which no electric field is applied, the liquid crystal molecules may be aligned so that the long axis thereof is perpendicular to the surfaces of the two panels 100 and 200.

The pixel electrode 191 applied with the data signal generates an electric field together with the common electrode 270 of the upper panel 200 to determine a direction of the liquid crystal molecules of the liquid crystal layer 3 between the two electrodes 191 and 270. According to the inclined degree of the liquid crystal molecules, variation in polarization of light inputted into the liquid crystal layer 3 varies and the variation of polarization is shown as variation in transmittance by a polarizer, such that the liquid crystal display displays the image.

As such, steps between other layers to be disposed above the first insulating layer 141 by the thick gate conductor 121 may be prevented from being increased by improving the flatness of the first insulating layer 141 through the primary preprocessed (circle mark) substrate 110 and the secondary preprocessed (solidus mark) gate conductor 121. Accordingly, the defective such as disconnection may be prevented from being generated at the other layers disposed above the first insulating layer 141.

In addition, since the flatness of the lower panel 100 is entirely improved, nonideal (e.g., mischarateristic) behaviors of the liquid crystal molecules can be prevented consequently performance of the liquid crystal display is improved.

In addition, the color filter 230 can be formed only in the openings 221 of the light blocking member 220 through the tertiary preprocessed (x mark) light blocking member 220 increasing the repellence between the color material and the surface of the light blocking member 220.

Hereinafter, a method of manufacturing a liquid crystal display according to exemplary embodiments of the present invention will be described with reference to FIG. 5 to FIG. 19.

FIG. 5 to FIG. 14 illustrate exemplary methods of manufacturing a lower panel of a liquid crystal display according to exemplary embodiments of the present invention.

Figure 5:
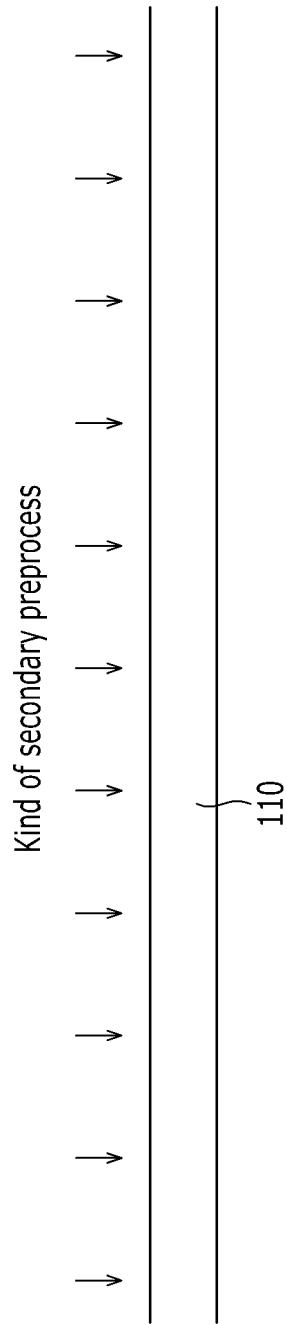
FIG. 5, FIG. 6, FIG. 7, FIG. 8, FIG. 9.
Figure 6:
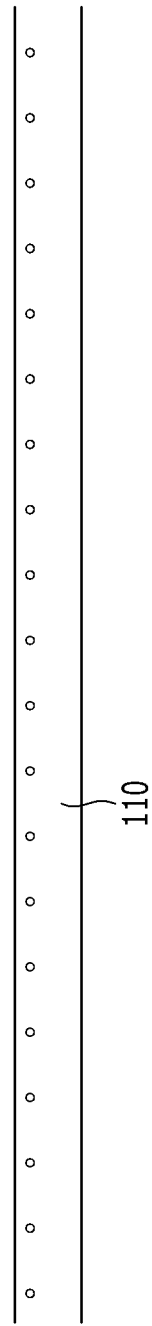

First, referring to FIG. 5 and FIG. 6, a substrate 110 made of an insulating material such as transparent glass or plastic is subjected to a primary preprocess. Surface energy of the primary preprocessed (circle mark) substrate 110 is increased as compared with a first reference value.

Figure 7:
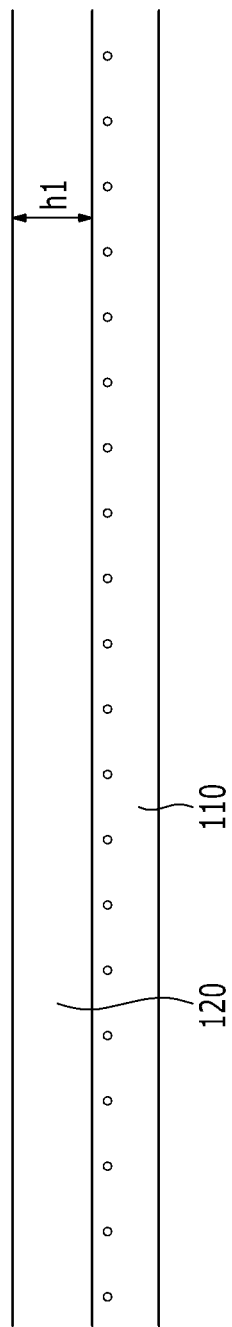

Referring to FIG. 7, for example, a gate conductive layer 120 is stacked on the primary preprocessed substrate 110 with a low-resistance metal such as an aluminum-based metal, a silver-based metal, and a copper-based metal. A thickness h1 of the gate conductive layer 120 may be about 0.3 um to about 2 um.

By way of example, the gate conductive layer 120 may be stacked by using a sputtering, an electroplating, an electroless plating, an inkjet printing, and a gravure printing methods.

Figure 8:
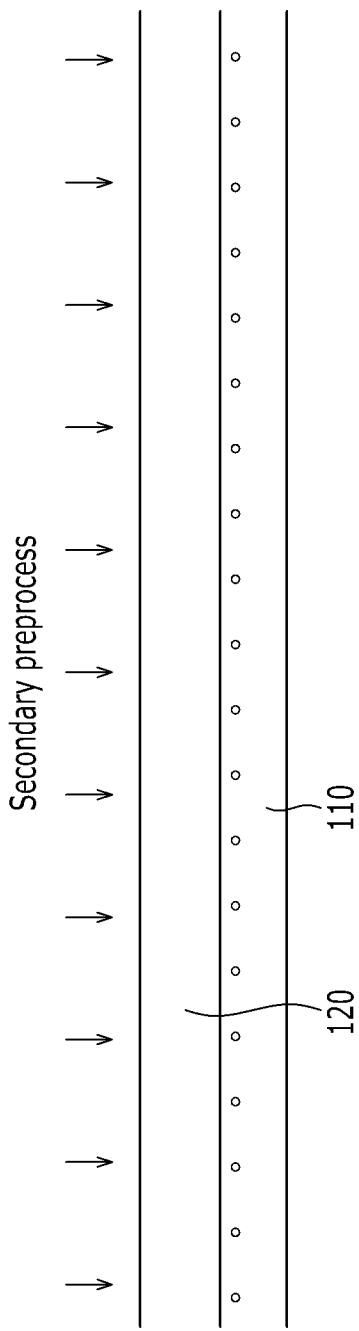

Referring to FIG. 8 and FIG. 9, the gate conductive layer 120 is subjected to a secondary preprocess. Surface energy of the secondary preprocessed (solidus mark) gate conductive layer 120 is decreased as compared with a second reference value.

Figure 10:
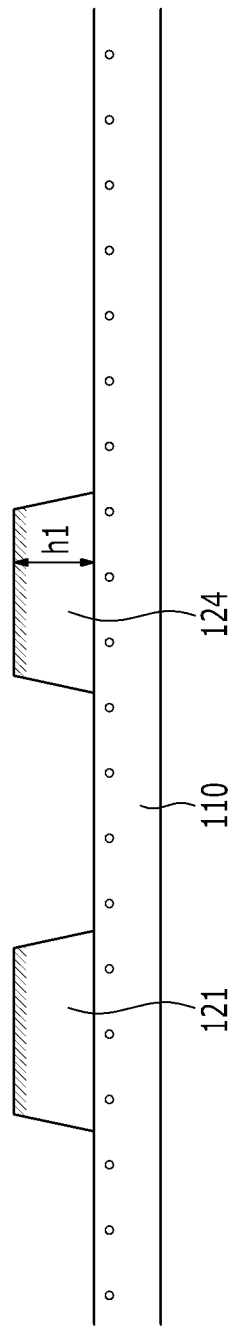
FIG. 10, FIG. 11, FIG. 12, FIG. 13 and FIG. 14 illustrate exemplary methods of manufacturing a lower panel of a liquid crystal display according to exemplary embodiments of the present invention.

Referring to FIG. 10, the secondary preprocessed gate conductive layer 120 forms gate conductors 121 and 124 including a plurality of gate lines 121 and a plurality of gate electrodes 124 protruding from the gate line 121 by patterning using photolithography.

Figure 11:
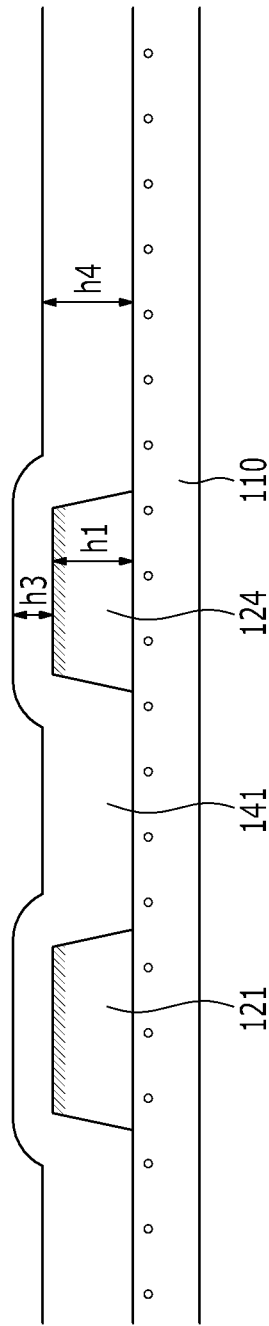

Referring to FIG. 11, a first insulating layer 141 is stacked on the primary preprocessed substrate 110 and the secondary preprocessed gate conductors 121 and 124.

When the first insulating layer 141 is formed on the primary preprocessed substrate 110 and the secondary preprocessed gate conductor 121, the first insulating layer 141 may be thickly formed on the substrate 110 having high surface energy. On the other hand, the first insulating layer 141 cannot be thickly formed on the gate conductor 121 having low surface energy. Accordingly, a thickness h4 of the first insulating layer 141 stacked just on the substrate 110 is larger than a thickness h3 of the first insulating layer 141 stacked just on the gate conductors 121 and 124. Therefore, a peak to valley which is a difference between the maximum thickness h1+h3 and the minimum thickness h4 of the first insulating layer 141 can be decreased and flatness of the first insulating layer 141 is improved.

Figure 12:
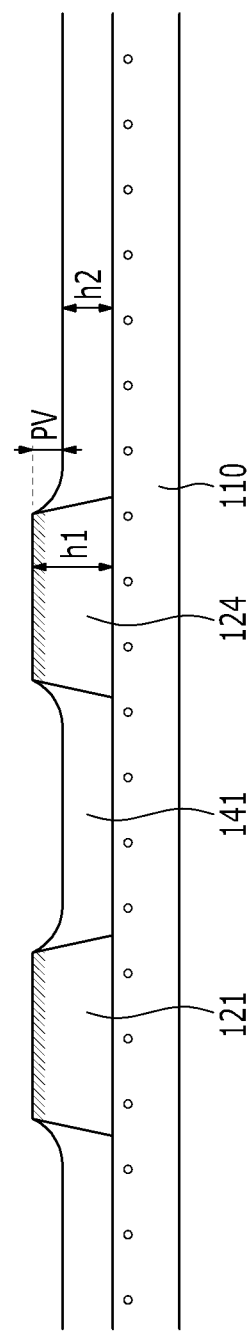

Referring to FIG. 12, for example, the first insulating layer 141 is etched until the gate conductors 121 and 124 are exposed. As shown in FIG. 11, since the peak to valley of the first insulating layer 141 is not large before etching, a peak to valley (PV) which is a difference between the maximum thickness h1 and the minimum thickness h2 of the first insulating layer 141 can be decreased even after the etching.

Figure 13:
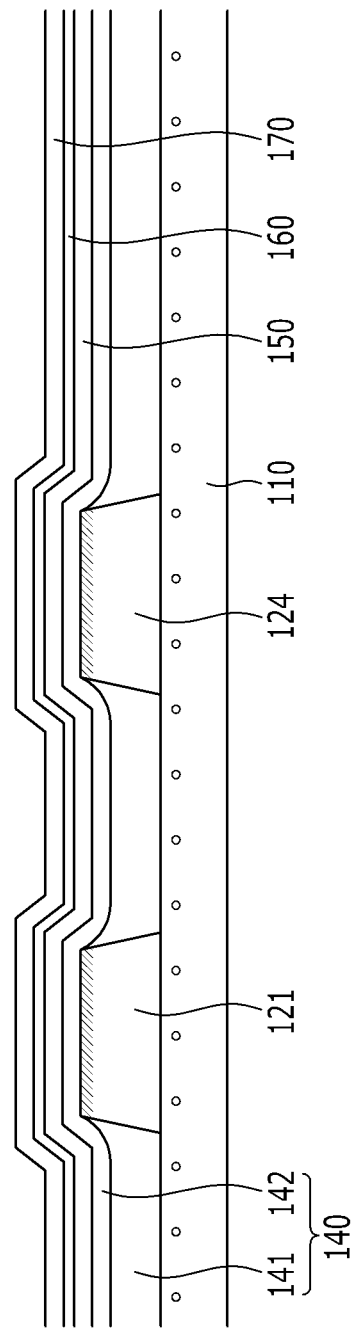

Referring to FIG. 13, a second insulating layer 142 is stacked on the first insulating layer 141 and the exposed gate conductors 121 and 124. As such, the gate insulating layer 140 may be formed as a dual-layered structure including the first insulating layer 141 and the second insulating layer 142. However, the gate insulating layer 140 may be formed as a single-layered structure, and in this example, the etching process of the first insulating layer 141 and the stacking process of the second insulating layer 142 in FIG. 12 may be omitted to avoid unnecessarily obscuring the present invention.

A semiconductor layer 150 and a semiconductor layer 160 doped with an impurity are sequentially stacked on the gate insulating layer 140 using a chemical vapor deposition method. Subsequently, the data conductive layer 170 is stacked by a sputtering method. As such, steps between the semiconductor layer 150, the semiconductor layer 160 doped with an impurity, and the data conductive layer 170 may be prevented from being increased by providing the high flatness of the gate insulating layer 140 through the primary preprocess and the secondary preprocess. Accordingly, the defective such as disconnection may be prevented at the other layers 150, 160, and 170 disposed above the gate insulating layer 140.

Figure 14:
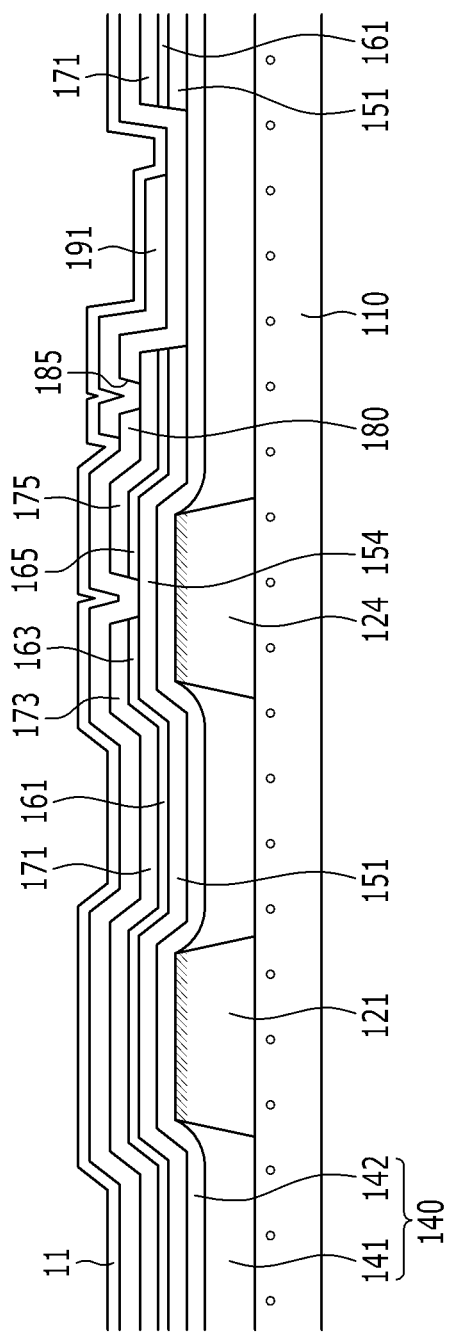
Figure 15:
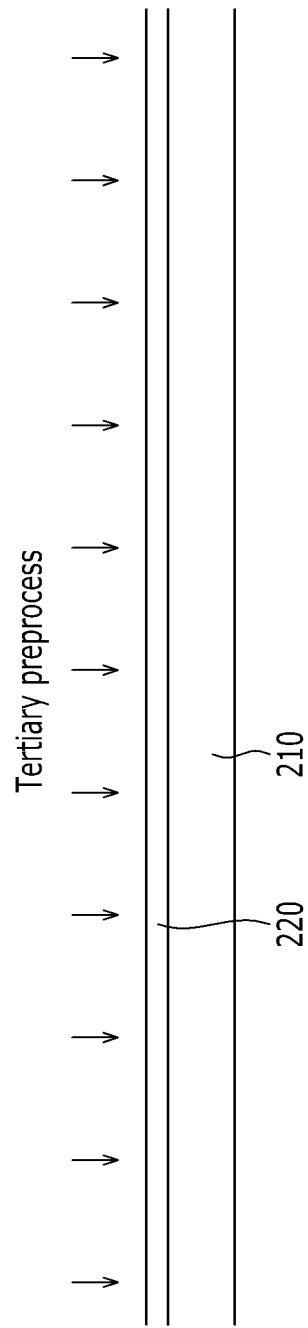
Figure 16:
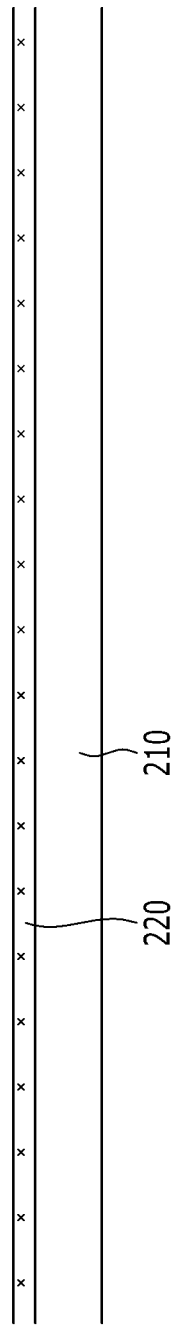
Figure 17:
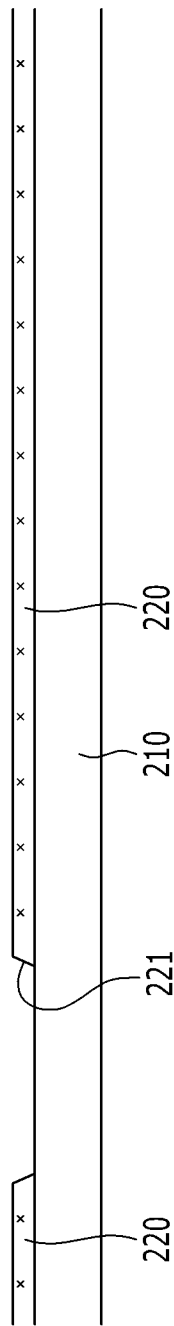

Referring to FIG. 14, for example, a plurality of data conductors 171 and 175, a plurality of ohmic contacts 161 and 165, a plurality of linear semiconductors 151 are formed by etching the data conductive layer 170 and the semiconductor layer 160 doped with an impurity.

Next, a plurality of contact holes 185 are formed by etching after the passivation layer 180 is formed by coating or stacking an organic insulating material or an inorganic insulating material. Next, a plurality of pixel electrodes 191 are formed by depositing and patterning an IZO or ITO layer on the passivation layer 180 using a sputtering method. Finally, an alignment layer 11 is formed by depositing a material such as polyimide-based polymer on the passivation layer 180. As a result, the lower panel 100 of FIG. 2 can be manufactured.

FIG. 15 to FIG. 19 illustrate exemplary methods of manufacturing an upper panel of a liquid crystal display according to exemplary embodiments of the present invention.

Referring to FIG. 15 to FIG. 18, a light blocking member 220 is subjected to a tertiary preprocess on a substrate 210 made of an insulating material such as transparent glass or plastic. A plurality of openings 221 are formed by etching the tertiary preprocessed (x mark) light blocking member 220. Next, color materials including pigments are coated in each of the plurality of openings 221 of the light blocking member 220 by an inkjet printing method to form the color filter 230. The repellence between the surface of the light blocking member 220 and the color material is increased through the tertiary preprocess. Accordingly, the color filter 230 can be formed only in the openings 221 of the light blocking member 220.

Referring to FIG. 19, for example, an overcoat 250 is formed by coating or stacking an insulating material on the light blocking member 220 and the color filter 230, a common electrode 270 is formed by depositing an ITO or IZO layer on the overcoat 250 using a sputtering method, and an alignment layer 21 is formed by depositing a material such as polyimide-based polymer on the common electrode 270. As a result, the upper panel 200 of FIG. 2 can be manufactured.

Therefore, a display device having improved flatness and a method of manufacturing the same can be provided.

The flatness of the insulating layer can be improved using the primary preprocessed substrate to increase the surface energy and using the secondary preprocessed conductor to decrease the surface energy. Accordingly, a number of steps required between other layers to be disposed above the insulating layer caused by a thick conductor can be optimally decreased. Therefore, a defective characteristic such as a disconnection can be prevented from being generated associated with the other layers disposed above the insulating layer. In addition, since the flatness of the entire panel is improved due to the insulating layer having the improved flatness, nonideal behaviors of the liquid crystal molecules can be prevented, thus preventing the liquid crystal display from being deteriorated.

Further, the color filter can be formed only in the openings of the light blocking member through the tertiary preprocessed light blocking member that increase the repellence between the color material and the surface of the light blocking member.

FIG. 20 is a flowchart of process for improving flatness of a display using a preprocess according to exemplary embodiments of the present invention.

As described, for example, as in step 500, performing a primary preprocess to a substrate to increase a surface energy of the substrate higher than a first reference value. In step 501, disposing a conductive layer on the substrate. The first reference value comprises a value prior to a preprocess being applied on the substrate. In step 503, performing a secondary preprocess to the conductive layer to decrease a surface energy of the conductive layer lower than a second reference value. The second reference value comprises a value prior to a preprocess being applied on the conductor. The method also includes forming a conductor by patterning the conductive layer, and forming an insulating layer on the substrate and the conductor.

According to exemplary embodiments, the method includes performing a preprocess to increase surface energy of a substrate using an attraction. The method also includes disposing a conductive layer on the preprocessed substrate. The method includes performing a preprocess to decrease surface energy of the conductive layer using a repulsion. And the method includes patterning a gate by forming the conductive layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a display device, the method comprising:
    performing a preprocess to a substrate to increase a surface energy of the substrate;
    disposing a conductive layer on the substrate;
    performing a preprocess to the conductive layer to decrease a surface energy of the conductive layer, the surface energy of the conductive layer being lower than the surface energy of the substrate;
    forming gates by patterning the conductive layer; and
    forming an insulating layer on the substrate and the gates, wherein forming the insulating layer comprises:
        coating a first insulating layer;
        etching the first insulating layer until the gates are exposed; and
        coating a second insulating layer on the first insulating layer, and
    wherein, after etching the first insulating layer, the first insulating layer is disposed continuously between adjacent ones of the gates.

2. The method of claim 1, wherein
the surface energy of the substrate, before the preprocessing, is less than the surface energy of the conductive layer, before the preprocessing.

3. The method of claim 1, wherein
performing a preprocess to a substrate comprises
processing $SF_6$ or $CF_4$ on the substrate by the PECVD method for about 10 seconds; and
washing the substrate at least one time.

4. The method of claim 1, wherein performing a preprocess to the conductive layer comprises processing $SF_6$ or $CF_4$ by the PECVD method for about 30 seconds.

5. The method of claim 1, wherein
forming an insulating layer comprises forming the insulating layer without washing step after the preprocess.

6. The method of claim 1, wherein
a peak to valley of the etched first insulating layer is about 0.6 um.

7. The method of claim 1, further comprising:
disposing substrates comprising a first substrate and a second substrate;
forming a color filter on a second substrate; and
attaching the second substrate with the first substrate.

8. The method of claim 7, wherein forming the color filter on the second substrate comprises
coating a light blocking member on the second substrate;
performing tertiary preprocess to the light blocking member;
forming a plurality of openings by etching the tertiary preprocessed light blocking member; and
forming the color filter by coating color materials on each of the plurality of openings by an inkjet printing method,
wherein the tertiary preprocess is performed for the light blocking member having a repellence with the color material.

9. The method of claim 8, wherein the color material comprises hydrophilic and the tertiary preprocess is performed for the light blocking member having a hydrophobic property.

10. A method comprising:
    performing a preprocess to increase a surface energy of a substrate using an attraction energy of interaction;
    disposing a conductive layer on the preprocessed substrate;
    performing a preprocess to decrease a surface energy of the conductive layer using a repulsion energy of interaction, the surface energy of the conductive layer being lower than the surface energy of the substrate;
    patterning gates by forming the conductive layer; and
    forming an insulating layer on the substrate and the gates, wherein forming the insulating layer comprises:
        coating a first insulating layer;
        etching the first insulating layer until the gates are exposed; and
        coating a second insulating layer on the first insulating layer, and
    wherein, after etching the first insulating layer, the first insulating layer is disposed continuously between adjacent ones of the gates.

* * * * *